United States Patent [19]

Iyota et al.

[11] Patent Number: 5,689,536
[45] Date of Patent: Nov. 18, 1997

[54] CLOCK SUPPLY APPARATUS INDICATING AND TRANSMITTING PRECISENESS OF GENERATED CLOCK SIGNAL

[75] Inventors: Toshio Iyota; Takeo Kato, both of Kawasaki, Japan

[73] Assignee: Fujitsu Limited, Kanagawa, Japan

[21] Appl. No.: 770,911

[22] Filed: Dec. 20, 1996

Related U.S. Application Data

[63] Continuation of Ser. No. 149,983, Nov. 10, 1993, abandoned.

[30] Foreign Application Priority Data

Nov. 10, 1992 [JP] Japan ................................. 4-299888

[51] Int. Cl.$^6$ ...................................... H04L 7/00; H04J 3/06
[52] U.S. Cl. ........................ 375/376; 375/226; 370/516; 331/49
[58] Field of Search ................................. 375/226, 228, 375/371, 373, 376; 370/516; 327/144; 331/25, 49

[56] References Cited

U.S. PATENT DOCUMENTS

| | | | |
|---|---|---|---|
| 4,972,442 | 11/1990 | Steierman | 375/108 |
| 5,184,350 | 2/1993 | Dara | 375/120 |
| 5,257,293 | 10/1993 | Taguchi | 375/119 |

FOREIGN PATENT DOCUMENTS

| | | | |
|---|---|---|---|
| 0278079 | 8/1988 | European Pat. Off. | 375/120 |
| 2228837 | 9/1990 | Japan. | |

OTHER PUBLICATIONS

R. Metz, et al., "Network Clock Synchronization", The Bell System Technical Journal, vol. 60, No. 6, Jul.–Aug. 1981, pp. 1109–1129.

Primary Examiner—Young T. Tse
Attorney, Agent, or Firm—Helfgott & Karas, P.C.

[57] ABSTRACT

A clock supply apparatus contains: a clock generating unit for generating a clock signal; a phase comparing unit for inputting a reference clock signal, and obtaining a phase difference between the reference clock signal and the clock signal generated by the clock generating unit; a frequency control unit for generating a control signal for controlling the frequency of the clock signal generated by the clock generating unit, based on the phase difference; a clock preciseness monitoring unit for monitoring preciseness of the clock signal, based on the phase difference; and a clock preciseness output unit for outputting information indicating the preciseness of the clock signal, based on the phase difference.

7 Claims, 10 Drawing Sheets

CLOCK SUPPLY APPARATUS INDICATING AND TRANSMITTING PRECISENESS OF GENERATED CLOCK SIGNAL

This is a continuation of application Ser. No. 08/149,983, filed Nov. 10, 1993, now abandoned.

BACKGROUND OF THE INVENTION

(1) Field of the Invention

The present invention relates to a clock supply apparatus which is equipped in each station in a communication network. The clock supply apparatus receives a reference clock signal supplied from another station located at a higher level, generates a clock signal synchronized with the reference clock signal, for its own station, and supplies the generated clock signal to respective portions in the station.

(2) Description of the Related Art

FIG. 1 is a diagram illustrating directions of clock signals supplied from stations of higher levels to stations of lower levels. In FIG. 1, reference numerals 101 to 112 each denote a station in a communication network, and the arrows indicate the directions of the supplied clock signals. In FIG. 1, stations of higher levels are indicated on the upper side of the figure, and stations of lower levels are indicated on the lower side of the figure. The station 101 of the highest level is a main station, and the station 102 is a sub-main station. Each of the main station 101 and the sub-main station 102 contains a cesium oscillator to generate a clock signal of high preciseness, and supplies the clock signal to other stations of lower levels. Each of the stations 103 to 112 contains a clock supply apparatus for generating a clock signal used in its own station, and each clock supply apparatus contains a digital controlled rubidium oscillator (DCRO) or a digital controlled crystal oscillator (DCXO). Each clock supply apparatus extracts a clock component (timing information) from one or more signals transmitted thereto from another one or more stations at higher levels, and supplies the extracted timing information to the digital controlled rubidium oscillator (DCRO) or a digital controlled crystal oscillator (DCXO), as the above reference clock signal so that the clock signal generated by the digital controlled rubidium oscillator (DCRO) or a digital controlled crystal oscillator (DCXO) synchronizes with the reference clock signal. The digital controlled rubidium oscillator (DCRO) or a digital controlled crystal oscillator (DCXO) can output a clock signal of a fixed frequency with preciseness of the digital controlled rubidium oscillator (DCRO) or a digital controlled crystal oscillator (DCXO), for a long time, when the above supply of the reference clock signal is stopped.

FIG. 2 is a diagram illustrating an example construction of the conventional clock supply apparatuses. In FIG. 2, reference numerals 121 and 122 each denote a clock receiving unit, 123 and 124 each denote a clock selection unit, 125 and 126 each denote a digital controlled phase-locked loop circuit (DPLL) or a phase locked oscillator (PLO), 25 and 26 each denote a pulse generator, 27 and 28 each denote a selector, and 29 and 30 each denote a clock distributor.

As indicated in FIG. 2, in the clock supply apparatus, all of the constituent elements are doubled, i.e., each constituent element is provided in both of the working system (N) and the protection system (E). The clock receiving units 121 and 122 receive different clock signals which are extracted from different transmission lines. Each of the clock selection switches 123 and 124 receives both the clock signals from the clock receiving units 121 and 122, and selects one of the received clock signals to supply the selected clock signal to a corresponding one of the digital controlled phase-locked loop circuit (DPLL) or phase-locked oscillator (PLO) 125 or 126. The digital controlled phase-locked loop circuits (DPLL) or phase-locked oscillators (PLO) 125 and 126 generate a clock signal for use in their own station, so that the clock signal generated in each of the digital controlled phase-locked loop circuits (DPLL) or phase-locked oscillators (PLO) 125 and 126 synchronizes with the clock signal supplied from the corresponding one of the clock selection switches 123 and 124.

Each of the pulse generators 25 and 26 contains a selector at its input stage, receives both the clock signals generated by the digital controlled phase-locked loop circuits (DPLL) or phase-locked oscillators (PLO) 125 and 126, selects one of the received clock signals, and divides the frequency of the selected clock signal to generate a set of a plurality of clock signals to be used in the station. Each of the selectors 27 and 28 receives both sets of the plurality of clock signals generated by the pulse generators 25 and 26, and selects one of the two sets of the plurality of clock signals to supply the selected set to a corresponding one of the clock distributors 29 and 30. Thus, the selected set of clock signals are supplied to respective portions of the station.

The precision of the digital controlled rubidium oscillator (DCRO) is substantially higher ($10^{-11}$) than that of the digital controlled crystal oscillator (DCXO). However, the pulling-in range of the digital controlled rubidium oscillator (DCRO) is narrower ($10^{-8}$) than that of the digital controlled crystal oscillator (DCXO). Therefore, a digital controlled rubidium oscillator (DCRO) tends to be adopted when a clock supply apparatus is newly equipped in a current communication network, while the older clock supply apparatus contains a digital controlled crystal oscillator (DCXO). As a result of this tendency, a situation can exist wherein a clock supply apparatus in a higher-level station contains an older digital controlled crystal oscillator (DCXO), and a clock supply apparatus in a lower-level station contains a new digital controlled rubidium oscillator (DCRO). In such a situation, since the pulling-in range of the digital controlled rubidium oscillator (DCRO) in the clock supply apparatus in the lower-level station is narrow, the digital controlled rubidium oscillator (DCRO) in the clock supply apparatus in the lower-level station may not be able to pull-in a clock signal generated by the clock supply apparatus in the higher-level station. When a clock supply apparatus cannot pull-in a clock signal which is supplied thereto, the clock supply apparatus may generate an alarm signal as abnormality in a transmission line or abnormality of the clock supply apparatus. In this case, conventionally, a maintenance person must investigate the cause of the abnormality by carrying a high-frequency counter to the place where the clock supply apparatus which outputs the alarm signal, is located and connecting the counter to the clock supply apparatus. Such a maintenance operation is bothersome, in particular, when the alarm is output from an unmanned station.

SUMMARY OF THE INVENTION

An object of the present invention is to provide a clock supply apparatus where a maintenance person can readily obtain information on preciseness of a clock signal generated in the clock supply apparatus.

Another object of the present invention is to provide a clock supply apparatus which enables a maintenance operation from a remote station.

According to the present invention, there is provided a clock supply apparatus which contains: a clock generating unit for generating a clock signal; a phase comparing unit for inputting a reference clock signal, and obtaining a phase difference between the reference clock signal and the clock signal generated by the clock generating unit; a frequency control unit for generating a control signal for controlling the frequency of the clock signal generated by the clock generating unit, based on the phase difference; a clock preciseness monitoring unit for monitoring preciseness of the clock signal, based on the phase difference; and a clock preciseness output unit for outputting information indicating the preciseness of the clock signal, based on the phase difference.

DESCRIPTION OF THE PREFERRED EMBODIMENTS

Figure 3:
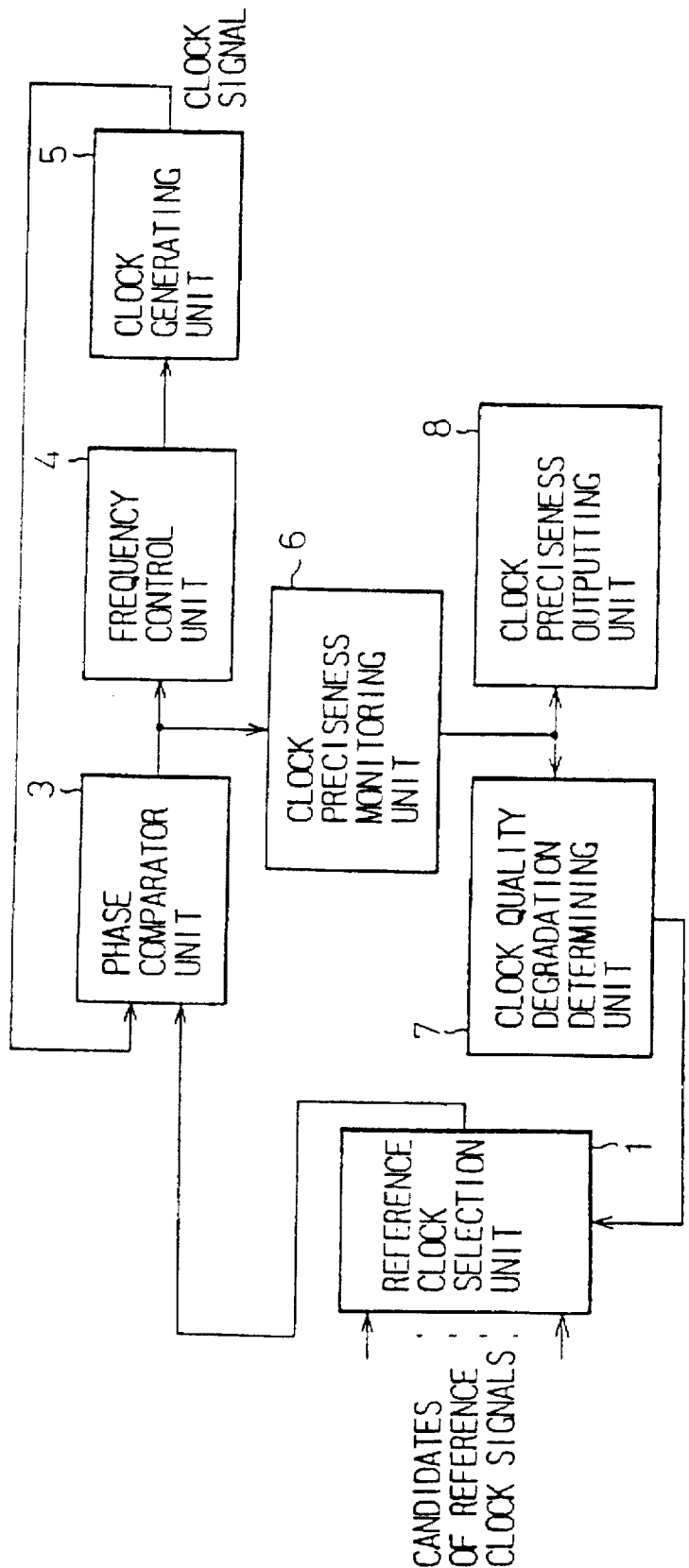
FIG. 3 is a diagram illustrating the basic construction of the clock supply apparatus according to the present invention.

Basic Construction of Present Invention (FIG. 3)

FIG. 3 is a diagram illustrating the basic construction of the clock supply apparatus according to the present invention.

In FIG. 3, reference numeral 1 denotes a reference clock selector unit, 3 denotes a phase comparing unit, 4 denotes a frequency control unit, 5 denotes a clock generating unit, 6 denotes a clock preciseness monitoring unit, 7 denotes a clock quality degradation determining unit, and 8 denotes a clock preciseness outputting unit. The clock generating unit 5 generates a clock signal, where the frequency of the clock signal is controlled by the frequency control unit 4. The phase comparing unit 3 is input a reference clock signal, and obtains a phase difference between the reference clock signal and the clock signal generated by the clock generating unit 5. The frequency control unit 4 generates a control signal for controlling the frequency of the clock signal generated by the clock generating unit 5, based on the phase difference. The clock preciseness monitoring unit 6 monitors preciseness of the clock signal, based on the phase difference. The clock preciseness output unit 8 outputs information indicating the preciseness of the clock signal, based on the phase difference.

The phase difference is generated by the phase comparing unit 3, and is inside information in a phase-locked loop constituted by the clock generating unit 5, the frequency control unit 4, and the phase comparing unit 3. In the clock supply apparatus according to the present invention, the phase difference is monitored by the clock preciseness monitoring unit 6, as information indicating preciseness of the clock signal generated by the clock generating unit 5, and is output by the clock preciseness outputting unit 8. Thus, a maintenance person can readily obtain information on the preciseness of the clock signal generated in the clock supply apparatus, and the information is useful to investigate the cause of abnormality when an alarm is output from the clock supply apparatus.

In the above construction of the present invention, the frequency control unit 4 may contain a digital controlled oscillator unit for outputting the control signal for controlling the frequency of the clock signal generated by the clock generating unit 5, based on the phase difference.

In the above construction of the present invention, the clock preciseness output unit 8 may contain a display unit for displaying the information indicating the preciseness of the clock signal. Thus, a maintenance person can readily obtain information on the preciseness of the clock signal generated in the remote clock supply apparatus.

In the above construction of the present invention, the clock preciseness output unit 8 may contain a transmission unit for transmitting the information indicating the preciseness of the clock signal onto a transmission line which is connected to the transmission unit. Thus, a maintenance person can obtain information on the preciseness of the clock signal generated in the remote clock supply apparatus.

In the above construction of the present invention, the clock preciseness output unit 8 may contain an alarm unit for determining whether or not the preciseness of the clock signal is degraded below a predetermined quality level, and outputting an alarm signal when the alarm unit determines that the preciseness of the clock signal is degraded below a predetermined quality level.

Further, as indicated in FIG. 3, in addition to the above construction, the clock supply apparatus may further contain: a reference clock signal selector unit 1 and a clock quality degradation determining unit 7. The reference clock signal selector unit 1 receives a plurality of candidates for the reference clock signal, and selects one of the plurality of candidates as the reference clock signal to supply the reference clock signal to the phase comparing unit 3. The clock quality degradation determining unit 7 determines whether or not the preciseness of the clock signal is degraded below a predetermined quality level, based on the phase difference, and generates and supplies to the reference clock selector unit a control signal for changing the selection at the reference clock signal selector unit 1 when the clock quality degradation determining unit 7 determines that the preciseness of the clock signal is degraded below a predetermined quality level. Thus, when at least one of the plurality of candidate reference clock signals is normal, the clock supply apparatus automatically selects the normal one of the candidate reference clock signals, and uses the selected candidate reference clock signal as the reference clock signal in the frequency comparing unit 4 so that the clock generating unit 5 generates the clock signal synchronized with the normal one of the candidate reference clock signals.

Figure 4:
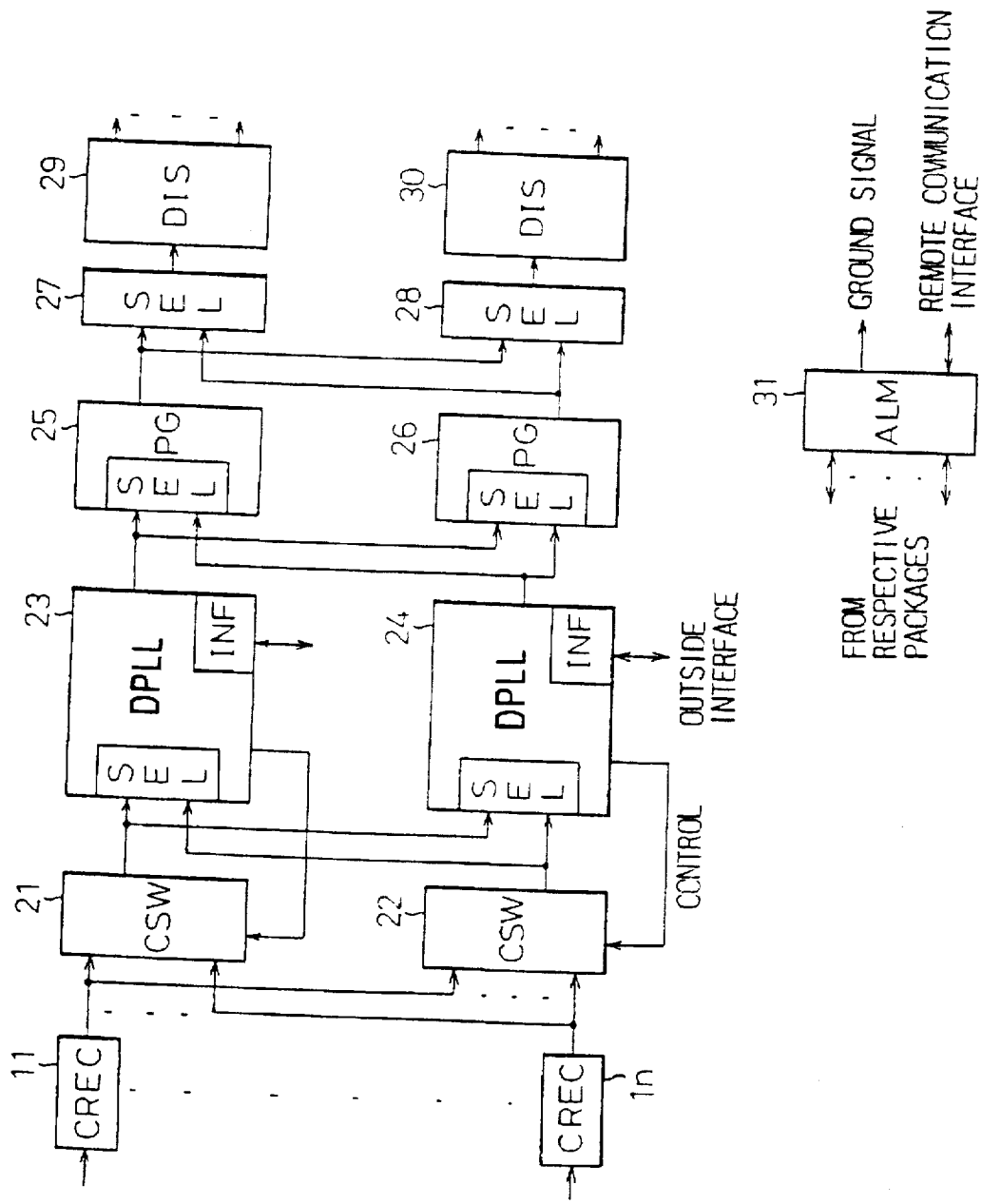
FIG. 4 is a functional diagram illustrating the outline of the construction of the reference clock selection and clock generation apparatus as an embodiment of the present invention.

Clock Supply Apparatus (FIG. 4)

Figure 1:
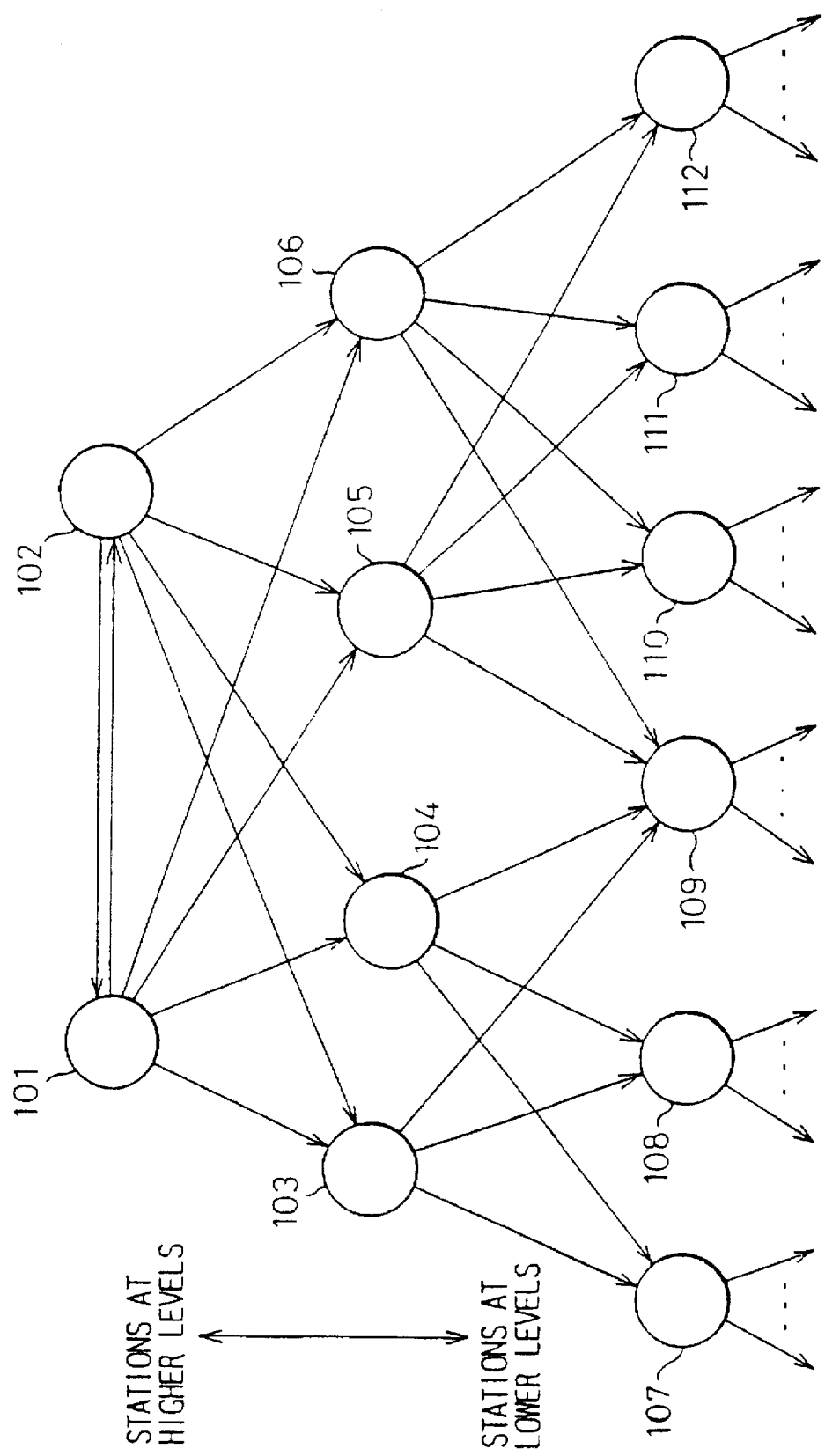
FIG. 1 is a diagram illustrating directions of clock signals supplied from stations of higher levels to stations of lower levels.
Figure 2:
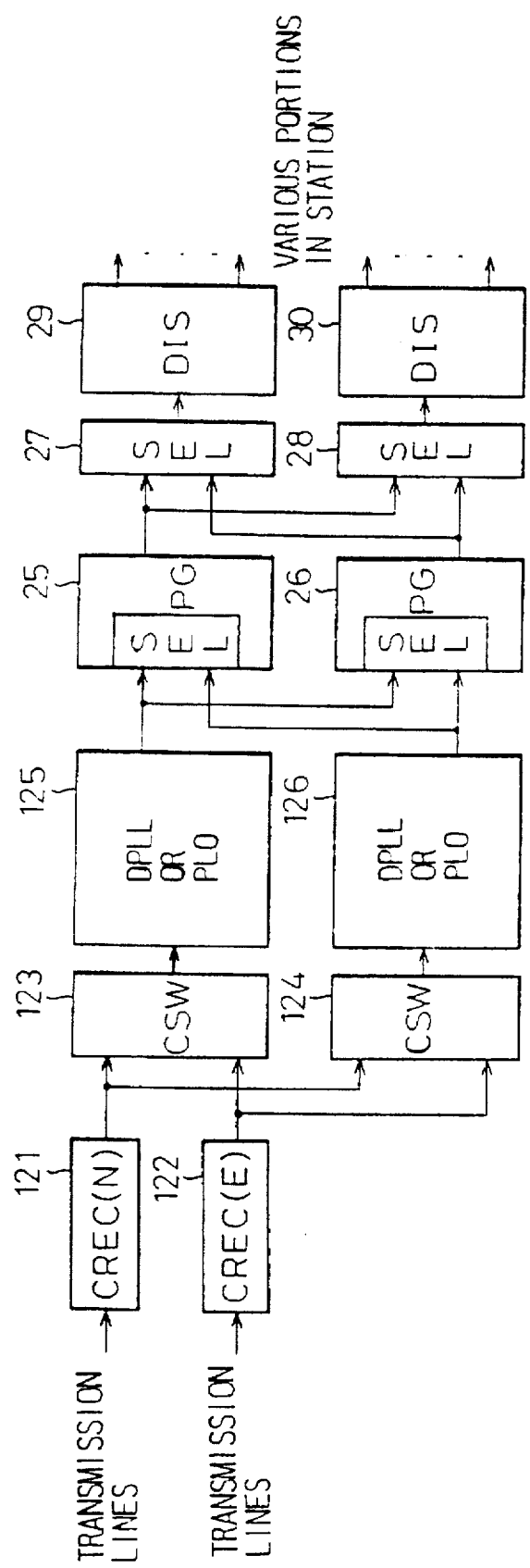
FIG. 2 is a functional diagram illustrating an exemplary construction of a prior art clock supply apparatuses.

FIG. 4 is a diagram illustrating the outline of the construction of the clock supply apparatus as an embodiment of the present invention. In FIG. 4, reference numerals 11 to 1n each denote a reference clock receiving unit, 21 denotes a reference clock selector switch in the working system, 22 denotes a reference clock selector switch in the protection system, 23 denotes a digital controlled phase-locked loop circuit (DPLL) in the working system, 24 denotes a digital controlled phase-locked loop circuit (DPLL) in the protection system, 31 denotes an alarm unit, and the other elements 25 to 30 are respectively the same as the corresponding elements in FIG. 2.

Each of the reference clock receiving units 11 to 1n supplies a clock signal which is extracted in the station in which the clock supply apparatus is equipped, to both of the reference clock selector switches 21 and 22. Each of the reference clock selector switches 21 and 22 receives a plurality of clock signals supplied from the reference clock receiving units 11 to 1n, and selects one of the plurality of clock signals to supply the selected one clock signal to both of the digital controlled phase-locked loop circuits (DPLL) 23 and 24. Each of the digital controlled phase-locked loop circuits (DPLL) 23 and 24 contains a selector SEL at its input stage, and selects one of the clock signals which are supplied from the reference clock selector switches 21 and 22 to input therein. Then, each of the digital controlled phase-locked loop circuits 23 and 24 (DPLL) generates a standard clock signal for use in the station where the standard clock signal synchronizes with the reference clock signal as the digital controlled phase-locked loop circuits (DPLL) or the phase-locked oscillators (PLO) 125 and 126 in FIG. 2 generate.

CLOCK GENERATOR UNIT (FIG. 5)

Figure 5:
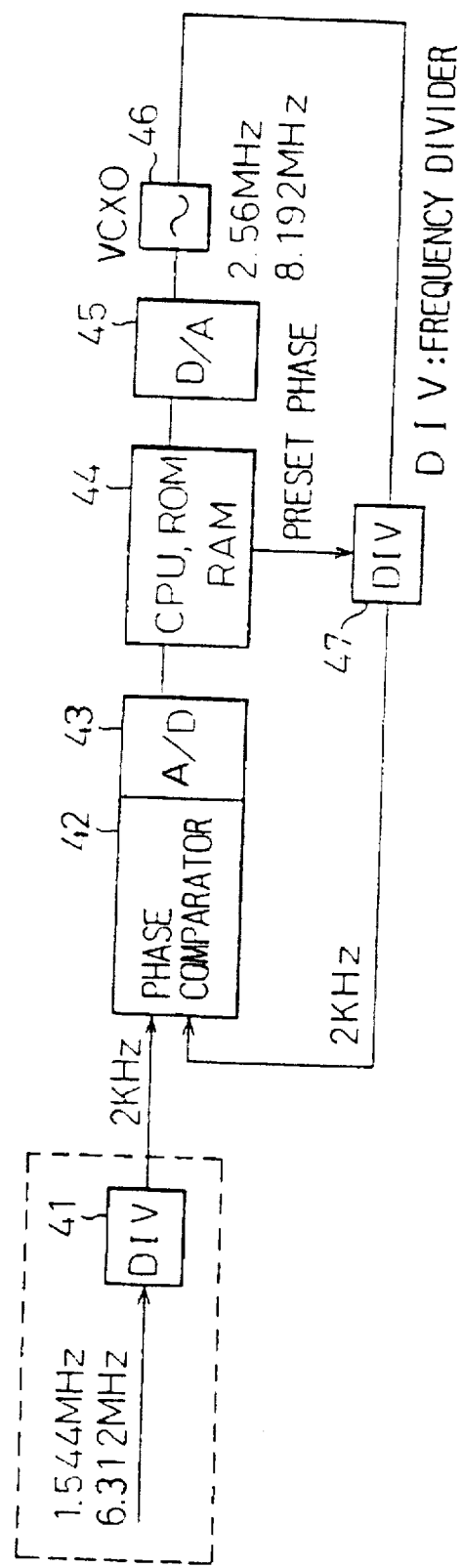
FIG. 5 is a diagram illustrating the construction of the clock generator unit which each of the digital controlled phase-locked loop circuits (DPLL) 23 and 24 in FIG. 4 comprises.

FIG. 5 is a diagram illustrating the construction of the clock generator unit which each of the digital controlled phase-locked loop circuits (DPLL) 23 and 24 in FIG. 4 comprises. In FIG. 5, 41 denotes a frequency divider, 42 denotes a phase comparator, 43 denotes an analog to digital converter, 44 denotes a controller comprising a central processing unit, a read-only memory (ROM), and a random access memories (RAM), 45 denotes a digital to analog converter, 46 denotes a digital controlled crystal oscillator (DCXO) or digital controlled rubidium oscillator (DCRO), and 47 denotes a frequency divider.

The frequency of the reference clock signal which is selected by the reference clock selector switch 21 or 22, and the selector SEL in the digital controlled phase-locked loop circuit (DPLL) 23 or 24, is, for example, 1.544 MHz or 6.312 MHz. The frequency of the clock signal is divided in the frequency divider 41 in FIG. 5 to generate a reference clock signal of 2 kHz. On the other hand, the digital controlled crystal oscillator (DCXO) or the digital controlled rubidium oscillator (DCRO) 46 generates a clock signal having a frequency in response to a clock signal which is converted to an analog signal by the digital to analog converter 45. This clock signal is supplied to the pulse generators 25 and 26 in FIG. 4 as a standard clock signal for use in the station, and further the clock signal is supplied to the frequency divider 47 in FIG. 5. The frequency divider 47 divides the frequency of the clock signal to generate a clock signal of a frequency of 2 kHz. The clock signal of 2 kHz is supplied to the phase comparator 42, where the phase of the clock signal is compared with the phase of the reference clock signal of 2 kHz. The phase comparator 42 outputs an analog signal indicating a phase difference between the above clock signal and the reference clock signal, and the analog signal is converted to a digital value by the analog to digital converter 43 to be supplied to the controller 44. The controller 44 reads the digital value, and outputs a digital control signal to control the digital controlled crystal oscillator (DCXO) or digital controlled rubidium oscillator (DCRO) 46 so that the phase difference is decreased. The digital control signal is converted to an analog signal by the digital to analog converter 45 to be supplied to the digital controlled crystal oscillator (DCXO) or digital controlled rubidium oscillator (DCRO) 46.

Figure 6:
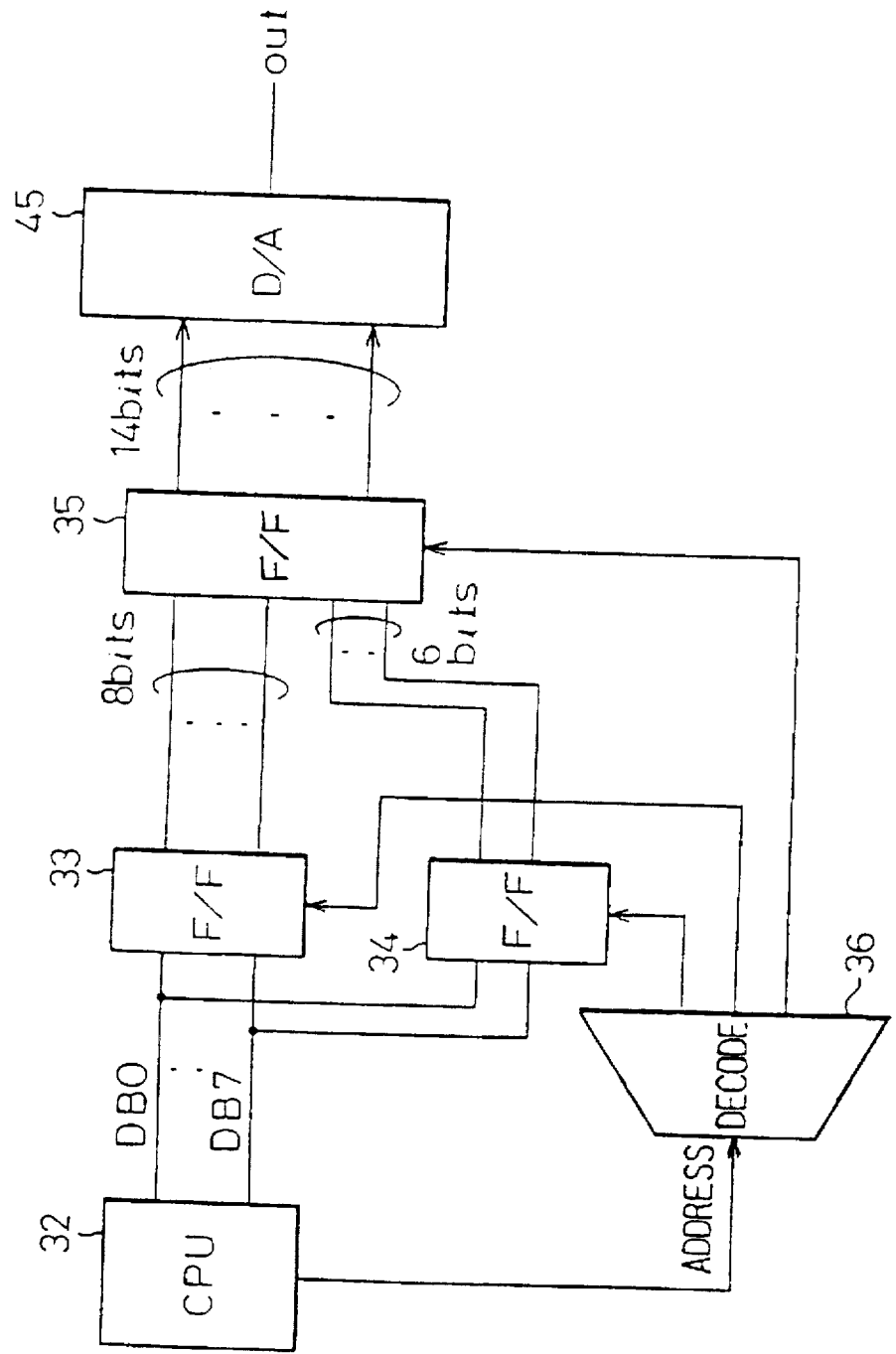
FIG. 6 is a diagram illustrating a detailed construction of the data width conversion circuit provided between a controller and a digital-to-analog converter of the clock generator unit of FIG. 5.

Data Width Conversion Circuit (FIG. 6)

Considering a difference in the data width in bits between the data input port of the digital to analog converter 45 and the data output port of the central processing unit, it is advantageous to provide an interface circuit (data width conversion circuit) as indicated in FIG. 6, between the controller 44 and the digital to analog converter 45 in FIG. 5. In FIG. 6, reference numeral 32 denotes a central processing unit in the controller 44, 33 and 34 each denotes a 8-bit register, 35 denotes a 14-bit register, and 36 denotes a decoder.

For example, in the case wherein the bit width of the data output port of the central processing unit 32 is eight bits, these eight bits are connected to the 8-bit input terminals of both of the 8-bit registers 33 and 34. The eight bits of the output of the register 33 are connected to eight significant bits of the fourteen input terminals of the 14-bit register 35, and six bits of the output of the register 34 are connected to the remaining six bits of the input terminals of the 14-bit register 35. At least two bits of the address output of the central processing unit 32 are applied to the decoder 36. The decoder 36 decodes the at least two bits to generate a control signal for controlling the data latch operations in the registers 33, 34, and 35.

When the central processing unit 32 supplies the digital control signal of fourteen bits to the digital to analog converter, the central processing unit 32 first applies eight significant bits of the digital control signal to the 8-bit register 33, and outputs an address signal to the decoder 36 so that the corresponding output of the decoder 36 makes the register 33 latch therein the applied eight bits. Next, the central processing unit 32 applies the remaining six bits of the digital control signal to the 8-bit register 34, and outputs an address signal to the decoder 36 so that the corresponding output of the decoder 36 makes the register 34 latch therein the applied six bits. Then, the central processing unit 32 outputs an address signal to the decoder 36 so that the output of the decoder 36 makes the 8-bit output of the register 33 and 6-bit output of the register 34 be latched in the 14-bit register 35. Thus, the fourteen-bit output of the 14-bit register 35 is applied to the digital to analog converter 45.

Figure 7:
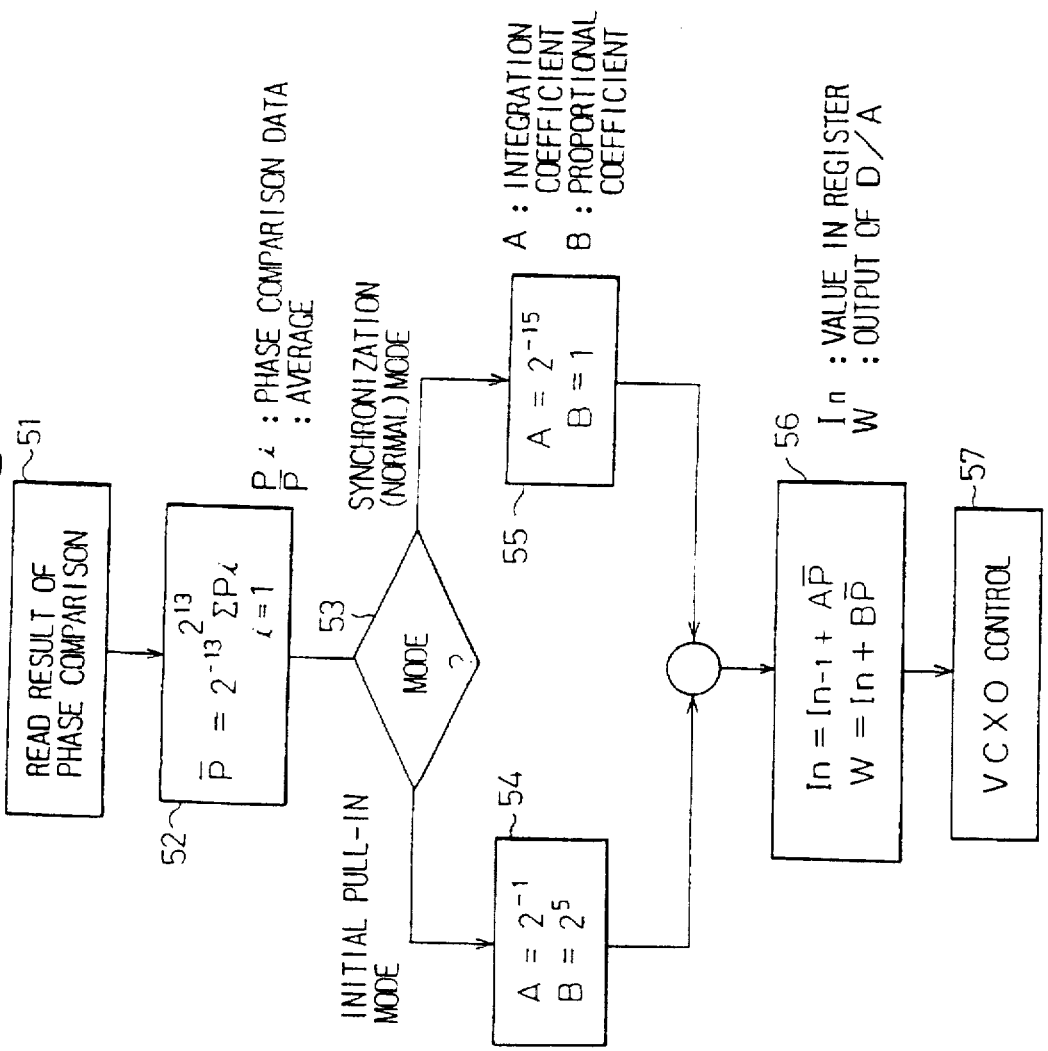
FIG. 7 is a flowchart .of the process executed in the digital controlled phase-locked loop circuit (DPLL) 44 in FIG. 5.

Processing in DPLL (FIG. 7)

FIG. 7 is a flowchart of the process executed in the digital controlled phase-locked loop circuit (DPLL) 44 in FIG. 5. In step 51 of FIG. 7, the phase difference data Pi output from the analog to digital converter 43 is periodically read out at intervals of 1 msec. In step 52, an average $\bar{P}$ of the above phase difference data for $2^{13}$ times is obtained. In step 53, it is determined whether or not the clock supply apparatus is in the initial pull-in mode or in the synchronization mode. When it is determined to be in the initial pull-in mode, in step 54, large values are set as coefficients A and B in calculation in step 56 so that a control voltage value of the digital controlled crystal oscillator (DCXO) is made large. Or, when it is determined to be in the initial pull-in mode, in step 55, small values are set as the coefficients A and B in the calculation in step 56 so that the control voltage value of the digital controlled crystal oscillator (DCXO) is made small. In step 56, the control voltage value W for the digital controlled crystal oscillator (DCXO) is calculated by the recurrence formula indicated in FIG. 7, where In (n=1, 2, . . . ) denote values held in a register (not shown), and W denotes the value of the output of the digital to analog converter 45.

Figure 8:
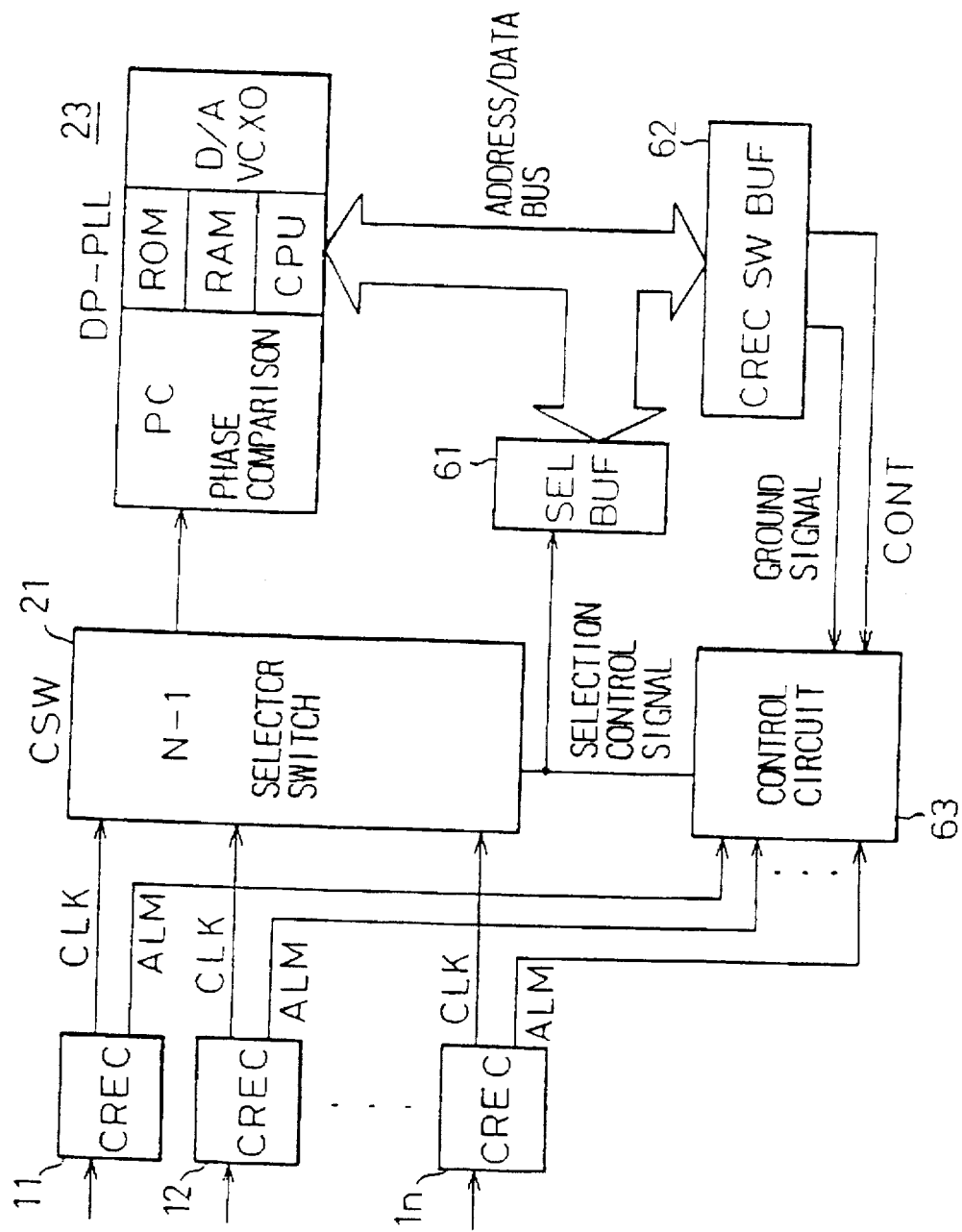
FIG. 8 is a diagram illustrating a detailed construction for switching the reference clock signal contained in the apparatus of FIG. 4.

Automatic Switching of Reference Clock (FIG. 8)

FIG. 8 is a diagram illustrating a detailed construction for switching the reference clock signal. The construction of FIG. 8 is contained in the clock supply apparatus of FIG. 4. In FIG. 8, reference numeral 61 denotes a selection buffer circuit, 62 denotes a reference clock switch signal buffer, and 63 denotes a switch control circuit. The other elements in FIG. 8 bear the same references as in FIG. 4.

Each of the reference clock receiving units 11 to 1n has a function of detecting failure in the clock signal input. When the reference clock receiving unit detects failure in the clock input, the reference clock receiving unit sends an alarm signal ALM to the control circuit 63. When one of the reference clock receiving units which is supplying a reference clock signal CLK currently selected by the reference clock selector switch 21, sends an alarm signal to the control circuit 63, the control circuit 63 controls the reference clock selector switch 21 so that the reference clock selector switch 21 selects another reference clock signal which is supplied from another reference clock receiving unit which does not output an alarm signal.

In addition, the controller 44 (FIG. 5) of the digital controlled phase-locked loop circuit (DPLL) 23 monitors the above-mentioned phase difference as information indicating preciseness of the clock signal generated in the clock supply apparatus. When the value of the phase difference exceeds a predetermined threshold value, the controller 44 sends a CONT signal to the control circuit 63 through the reference clock switch signal buffer 62. When the control circuit 63 receives the CONT signal, the control circuit 63 further receives a reference clock switch signal from the controller 44 through the reference clock switch signal buffer 62, and controls the reference clock selector switch 21 in accordance with the reference clock switch signal. Namely, the controller 44 indirectly controls the reference clock selector switch 21 so that reference clock selector switch 21 selects a reference clock signal which makes the phase difference not exceed the predetermined threshold value. Thus, the preciseness of the clock signal generated in the clock supply apparatus can be maintained automatically. The control signal output from the control circuit 63 is latched in the selection signal buffer 61 to indicate which reference clock signal is currently selected in the reference clock selector switch 21.

Figure 9:
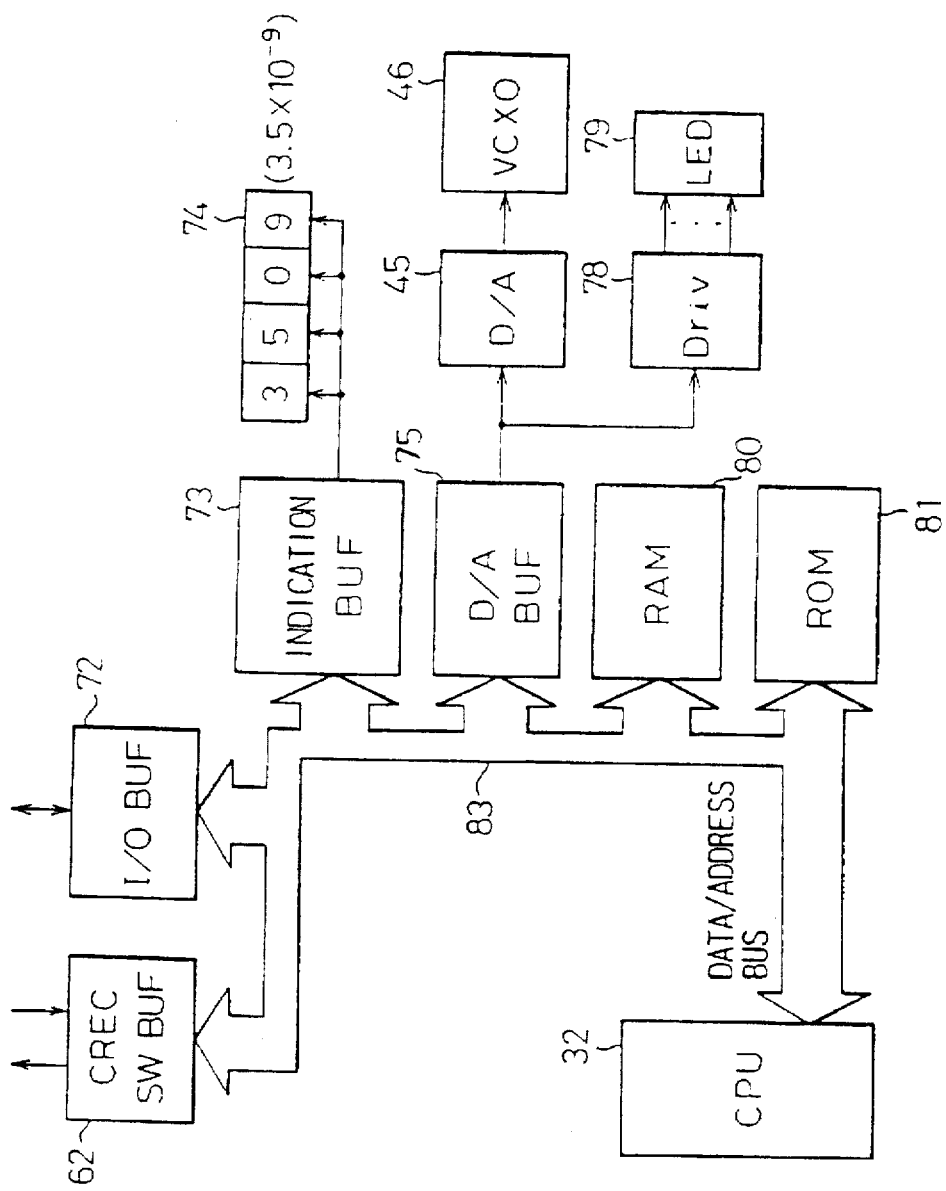
FIG. 9 is a diagram illustrating a construction for indicating preciseness of the clock signal generated in the clock supply apparatus of FIG. 4, and an alarm state of the clock supply apparatus.

Indication of Preciseness and Alarm (FIG. 9)

FIG. 9 is a diagram illustrating a construction for indicating preciseness of the clock signal generated in the clock supply apparatus, and an alarm state of the clock supply apparatus. The construction of FIG. 9 is contained in the clock supply apparatus of FIG. 4. In FIG. 9, reference numeral 72 denotes an input/output buffer, 73 denotes an indication buffer, 74 denotes an indicator, 74 denotes a digital to analog conversion buffer, 78 denotes a light emitting diode (LED) driver, 79 denotes a light emitting diode (LED), 80 denotes the random access memories (RAM) in the controller 44, 81 denotes the read-only memory (ROM) in the controller 44, and 83 denotes an address/data bus in the controller 44. The other elements in FIG. 9 are the same as the elements bearing the same reference numerals in the other figures.

As explained before, the central processing unit 32 in the controller 44 monitors the phase difference data which is supplied from the phase comparator 42 (FIG. 5) through the analog to digital converter 43. The controller 44 further converts the phase difference data into an error data indicating a degree of preciseness of the clock signal, and supplies the converted error data to the indicator 74 through the indicator buffer 73 to indicate the error data on the indicator 74. The indicator 74 may be, for example, a liquid crystal display device, and the preciseness of the clock signal may be, for example, by a mantissa of two digits and an index of two digits.

The read-only memory (ROM) 81 in FIG. 9 stores firmware for the central processing unit, the random access memories (RAM) 80 provides a working area and a data storage area for the central processing unit. The light emitting diode (LED) is used as an alarm lamp which emits a light when abnormality occurs in the clock supply apparatus or in the transmission line. The input/output buffer 72 is provided as an interface for connecting input/output devices for a maintenance person to write control data or a program, or to output log data. The input/output buffer 72 is further used for the central processing unit 32 to send and receive control signals therethrough to control the above input/output devices and to input and output data.

Figure 10:
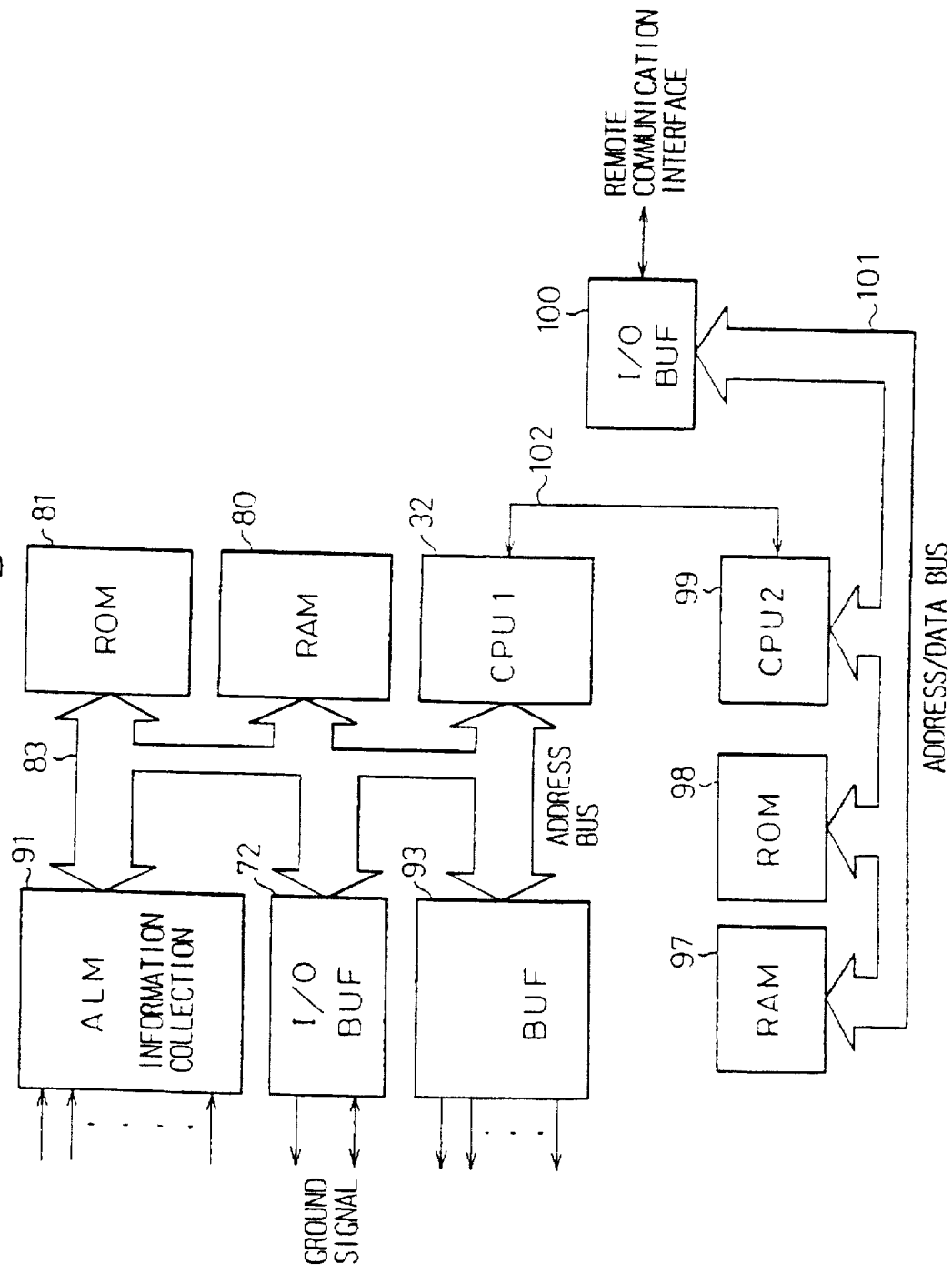
FIG. 10 is a diagram illustrating a construction for remote communication control and alarm notification, contained in the apparatus of FIG. 4.

Remote Communication and Alarm Notification (FIG. 10)

FIG. 10 is a diagram illustrating a construction for remote communication control and alarm notification. The construction of FIG. 10 is contained in the clock supply apparatus of FIG. 4. In FIG. 10, reference numeral 91 denotes an alarm information collecting unit, 93 denotes a control buffer, 97 denotes a random access memories (RAM), 98 denotes a read-only memory (ROM), 99 denotes a second central processing unit, 100 denotes a communication interface for remote communication, and 101 denotes a bus. The other elements in FIG. 10 are the same as the elements bearing the same reference numerals in the other figures.

According to the construction of FIG. 10, the central processing unit 32 can transmit alarm information collected by the alarm information collecting buffer 91, to the second central processing unit 99 through the signal line 102. Receiving the alarm information, the second central processing unit 99 can form a predetermined communication format containing the alarm information to transmit the communication format to a remote station through the communication interface 100. In addition, the second central processing unit 99 can receive through the remote communication interface 100, commands (requesting to switch transmission lines, to switch the reference clock signal, to transmit alarm information, to transmit log data, to transmit information on the switching of the transmission lines and the reference clock signal, and the like), control data, program change data, or the like. When the second central processing unit 99 receives the above information through the remote communication interface 100, the second central processing unit 99 transfers the received information to the central processing unit 32 through the signal line 102 so that the central processing unit 32 can perform processing in response to the received information. For example, when the read-only memory (ROM) 81 is a rewritable type such as an electrically erasable programmable read-only memory (EEPROM), the content of the read-only memory (ROM) can be changed by the above remote communication.

The above alarm information collection buffer 91 is connected to the alarm unit 31 in FIG. 4. The alarm unit 31 collects various alarm (abnormality) information of the clock supply apparatus, and transmits the collected information to the central processing unit 32 through the alarm information collection buffer 91.

The above log data can be obtained by recording information such as an occurrence of an alarm together with the time of the occurrence in the random access memories (RAM) 80. The time of occurrence is obtained by a timer (not shown).

Further, the alarm information may be notified through the input/output buffer 72 as a ground (earth) signal to a remote station.

As explained above, by a clock supply apparatus according to the present invention, the preciseness of the clock signal generated in the clock supply apparatus can be output (indicated or transmitted). In addition, the reference clock signal used in the clock supply apparatus can be automatically changed to another reference clock signal when the preciseness of the generated clock signal is degraded. Further, remote control of the clock supply apparatus and remote collection of information on the clock supply apparatus become possible, and this is advantageous for maintenance operations.

We claim:

1. A clock supply apparatus comprising:
    clock generating means for generating a clock signal having a frequency;
    phase comparing means for inputting a reference clock signal, and for obtaining a phase difference between the reference clock signal and the clock signal generated by the clock generating means;
    frequency control means for generating a control signal for controlling said frequency of the clock signal generated by the clock generating means, based on the phase difference;
    a clock preciseness monitoring means, coupled to said phase comparing means, for monitoring preciseness of the clock signal, based on the phase difference;
    a clock preciseness output means for outputting information indicating the preciseness of the clock signal, based on the phase difference; and
    a command receiving means for receiving a command from outside said clock supply apparatus, said command requesting at least one of switching transmission lines, switching said reference clock signal, rewriting a program in a memory, rewriting control data in a memory, transmission of said information indicating preciseness of the clock signal, transmission of alarm information, transmission of log data, transmission of information on the switching of the transmission lines, and transmission of information on the switching of the reference clock signal.

2. The clock supply apparatus according to claim 1, wherein said frequency control means comprises a digital controlled oscillator means for outputting the control signal for controlling the frequency of the clock signal generated by the clock generating means, based on the phase difference.

3. The clock supply apparatus according to claim 1, wherein said clock preciseness output means comprises a display means for displaying the information indicating the preciseness of the clock signal.

4. The clock supply apparatus according to claim 1, wherein said clock preciseness output means comprises a transmission means for transmitting, in response to receiving said command, information indicating the preciseness of the clock signal onto a transmission line which is connected to the transmission means.

5. The clock supply apparatus according to claim 1, wherein said clock preciseness output means comprises an alarm means for determining whether or not the preciseness of the clock signal is degraded below a predetermined quality level, and outputting an alarm signal when the alarm means determines that the preciseness of the clock signal is degraded below the predetermined quality level.

6. The clock supply apparatus according to claim 1, further comprising,
    reference clock signal selector means for receiving a plurality of reference clock signals and for selecting one of the plurality of reference clock signals to supply to the phase comparing means, and
    a clock quality degradation determining means for determining whether or not the preciseness of the clock signal generated by the clock generating means is degraded below a predetermined quality level, based on a phase difference with said selected reference clock signal, and generating and supplying to the reference clock selector means a control signal for changing from said one selected reference clock signal at the reference clock signal selector means to another reference clock signal when the clock quality degradation determining means determines that the preciseness of the clock is degraded below the predetermined quality level.

7. The clock supply apparatus according to claim 1, further comprising an apparatus control means for controlling at least one operation of said clock supply apparatus in accordance with said received command.

* * * * *